(12) United States Patent  (10) Patent No.: US 7,554,331 B2
Ichimura et al.  (45) Date of Patent: Jun. 30, 2009

(54) ELECTRIC POTENTIAL MEASURING DEVICE AND IMAGE FORMING APPARATUS

(75) Inventors: Yoshikatsu Ichimura, Setagaya-ku (JP); Takayuki Yagi, Yokohama (JP); Yoshitaka Zaitsu, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/727,672

(22) Filed: Mar. 28, 2007

(65) Prior Publication Data
US 2007/0247166 A1 Oct. 25, 2007

Related U.S. Application Data

(62) Division of application No. 10/550,450, filed as application No. PCT/JP2004/004343 on Mar. 26, 2004, now Pat. No. 7,265,554.

(30) Foreign Application Priority Data
Mar. 28, 2003 (JP) ............... 2003-092212

(51) Int. Cl.
G01R 29/12 (2006.01)
G01R 27/26 (2006.01)
(52) U.S. Cl. .............. 324/458; 324/663; 324/660
(58) Field of Classification Search ........ 324/663, 324/522, 713, 458, 660
See application file for complete search history.

(56) References Cited

U.S. PATENT DOCUMENTS

| 3,852,667 | A | 12/1974 | Williams et al. | 324/72 |
|---|---|---|---|---|
| 4,115,783 | A | 9/1978 | Reggia | 343/792 |
| 4,205,267 | A | 5/1980 | Williams | 324/458 |
| 4,553,099 | A | 11/1985 | Kasahara et al. | 324/458 |
| 4,720,682 | A | 1/1988 | Ikushima et al. | 324/458 |
| 4,801,967 | A | 1/1989 | Snelling | 355/3 |
| 4,839,581 | A | 6/1989 | Peterson, Jr. | 324/72 |

(Continued)

FOREIGN PATENT DOCUMENTS

DE 2715831 10/1978

(Continued)

OTHER PUBLICATIONS

Hsu C. H. et al: "Micromechanical electrostatic voltmeter"Tranducers. San Francisco, Jun. 24-27, 1991, Proceedings of the International Conference on Solid State Sensors Andactuators, New York, IEEE, US, vol. Conf. 6, Jun. 24, 1991, pp. 659-662.

(Continued)

*Primary Examiner*—Timothy J Dole
*Assistant Examiner*—John Zhu
(74) *Attorney, Agent, or Firm*—Fitzpatrick, Cella, Harper & Scinto

(57) ABSTRACT

An electric potential measuring device has a detection electrode of a conductive material disposed in opposition to an object and a movable structure including a first solid material portion of a dielectric and a second solid material portion of another dielectric or a conductive material. A charge induced on the detection electrode by electric lines of force from the object is modulated by moving the movable structure with a drive mechanism, to measure an electric potential of the object. An image forming apparatus has the electric potential measuring device and an image forming unit for performing a control of an image formation by using the electric potential measuring device.

14 Claims, 16 Drawing Sheets

U.S. PATENT DOCUMENTS

| | | | |
|---|---|---|---|
| 5,151,659 A | 9/1992 | Tanaka et al. | 324/458 |
| 5,212,451 A | 5/1993 | Werner, Jr. | 324/458 |
| 5,260,567 A | 11/1993 | Kuroda et al. | 250/227.19 |
| 5,317,152 A | 5/1994 | Takamatsu et al. | 250/306 |
| 5,357,108 A | 10/1994 | Suzuki et al. | 250/306 |
| 5,504,356 A | 4/1996 | Takeuchi et al. | 257/254 |
| 5,517,123 A | 5/1996 | Zhao et al. | 324/458 |
| 5,554,851 A | 9/1996 | Hirai et al. | 250/442.11 |
| 5,658,698 A | 8/1997 | Yagi et al. | 430/11 |
| 5,673,476 A | 10/1997 | Akaike et al. | 29/825 |
| 5,820,648 A | 10/1998 | Akaike et al. | 65/36 |
| 5,923,637 A | 7/1999 | Shimada et al. | 369/126 |
| 6,020,215 A | 2/2000 | Yagi et al. | 438/52 |
| 6,072,764 A | 6/2000 | Shido et al. | 369/126 |
| 6,177,800 B1 | 1/2001 | Kubby et al. | 324/458 |
| 6,337,477 B1 | 1/2002 | Shimada et al. | 250/216 |
| 6,418,006 B1 | 7/2002 | Liu et al. | 361/277 |
| 6,965,239 B2 | 11/2005 | Yasuda et al. | 324/458 |
| 2003/0057977 A1 | 3/2003 | Werner, Jr. et al. | 324/754 |
| 2006/0001432 A1 | 1/2006 | Yasuda et al. | 324/458 |
| 2006/0008284 A1 | 1/2006 | Ushijima et al. | 399/48 |
| 2006/0171728 A1 | 8/2006 | Ichimura et al. | 399/48 |
| 2006/0192565 A1 | 8/2006 | Yasuda et al. | 324/458 |

FOREIGN PATENT DOCUMENTS

| | | |
|---|---|---|
| DE | 10044887 | 5/2001 |
| EP | 1003044 | 5/2000 |
| JP | 54-107781 | 8/1979 |
| JP | 2-071166 | 3/1990 |
| JP | 4-025764 | 1/1992 |
| JP | 6-196721 | 7/1994 |
| JP | 6-196722 | 7/1994 |

OTHER PUBLICATIONS

Riehl P.S. "Microsystems for Electrostatic Sensing" Dissertation, Online! Nov. 2002 p. 1-8, 32-40, 79-84 (http://www-bsac.eecs.berkeley.edu/publications/search/zoom.php?urltimestamp=1040564878).

ELECTRIC POTENTIAL MEASURING DEVICE AND IMAGE FORMING APPARATUS

This application is a divisional of application Ser. No. 10/550,450 filed on Sep. 26, 2005 now U.S. Pat. No. 7,265,554, which was the National Stage of International Application No. PCT/JP2004/004343, filed Mar. 26, 2004, the contents both of which are incorporated by reference herein.

TECHNICAL FIELD

The present invention relates to an image forming apparatus having an electric potential measuring device applicable to the non-contact type potential measuring device, a copier, a printer and the like.

BACKGROUND ART

Heretofore, for example, in an image forming apparatus having a photosensitive drum and performing an image formation by an electrophotography system, it is necessary to properly charge, that is, typically uniformly charge a potential of the photosensitive drum under any circumstance in order to constantly obtain a stabilized image quality. Hence, the charged potential of the photosensitive drum is measured by using an electric potential measuring device (hereinafter, also referred to as "potential sensor"), and by utilizing the measurement result, a feed back control is performed so as to uniformly keep the potential of the photosensitive drum.

As for a conventional potential sensor, there is available a non-contact type potential sensor. Here, a system called as a mechanically modulated alternating electric field induction type is often used. According to this system, the potential of the surface of a measuring object is a function of the magnitude of the current taken out from a detection electrode contained in the potential sensor, given by the following formula:

$$i = dQ/dt = d(CV)/dt \quad (1)$$

Here, Q denotes a charge to appear on the detection electrode, C a coupling capacitance between the detection electrode and the measuring object, and V an electric potential of the surface of the measuring object, and this capacity C is given by the following formula:

$$C = AS/x \quad (2)$$

Here, A denotes a proportionality constant, S a detection electrode area, and x a distance between the detection electrode and the measuring object.

Although a potential V of the surface of the measuring object is measured by using these relationships, in order to accurately measure the charge Q to appear on the detection electrode, it has been so far understood that the magnitude of the capacitance C between the detection electrode and the measuring object is better to be periodically modulated. As for the modulating method of this capacitance C, there are available two types of the method: a vibration capacitance type in which a distance x between the detection electrode and the measuring object is changed, and a chopper type in which an effective detection electrode area S is changed. As for the chopper type, the following method is known.

A first method is to effectively modulate the area S of the detection electrode. A fork-shaped metal shutter is inserted between the measuring object and the detection electrode, and the shutter is periodically moved in a parallel direction with the surface of the measuring object, so that a shielding extent of the electric lines of force from the measuring object reaching on the detection electrode is changed and the area of the detection electrode is effectively changed, thereby realizing the modulation of an electrostatic capacitance C between the measuring object and the detection electrode (see U.S. Pat. No. 4,720,682).

The second method is to dispose a metal shield member having an aperture in a position opposite to the measuring object and provide the detection electrode in a top end of the fork-shaped vibration element so that the position of the detection electrode is changed in parallel directly below the aperture, thereby modulating the number of electric lines of force reaching the detection electrode and modulating the electrostatic capacitance C (see U.S. Pat. No. 3,852,667).

On the other hand, in order to downsize the electrophotographic image forming apparatus, it is necessary to effect reduction in the diameter of the photosensitive drum and increase in the packaging density of parts neighboring the drum, and at the same time, downsizings as well as a thin down of the potential sensor are required. However, in the above-described sensor of the current mechanically modulated alternating electric field induction type, the inner volume of a sensor structure is occupied by assembling parts such as a drive mechanism and the like for vibrating the fork-shaped shutter or the fork-shaped vibration element. Hence, for the downsizing of the potential sensor, it is essential to downsize these drive mechanisms.

In recent year, experiments have been reported in which by utilizing a semiconductor processing technology called as Micro Electro Mechanical System (MEMS), a fine mechanical structure is formed on a semiconductor substrate. The mechanically modulated alternating electric field induction type potential sensor using such technology has been also reported. As a typical example, there is a case in which a shutter structure having the fine opening portion prepared by the semiconductor processing technology is vibrated directly above the detection electrode, thereby attempting to measure the electric potential of the measuring object (see U.S. Pat. No. 6,177,800).

PROBLEMS TO BE SOLVED BY THE INVENTION

In the potential sensor of the mechanically modulated alternating electric field induction type using the above-described conventional technology, the fork-shaped shutter or the fork-shaped vibration element in the top end of which is provided the detection electrode is vibrated directly above the detection electrode by using a piezoelectric element drive mechanism and the like so as to perform the modulation of the number of electric lines of force reaching the detection electrode. In order to effectively obtain a signal output of a practical level from the detection electrode, a typical area size of the detection electrode is made about 2 mm×2 mm to be used, and a typical length of the shutter is made about 20 mm to be used. Consequently, as for a potential sensor to be mounted on a downsized electrophotographic image forming apparatus, further downsizing and thin down are required.

According to the MEMS technology, a movable mechanical part can be constituted by a member having a thickness of about 1 μm to 100 μm. However, even if an attempt is made to prepare the shutter with an opening portion for the potential sensor by using such parts, its shape receives restrictions from the viewpoint of a manufacturing process difficulty and a mechanical strength.

The potential sensor used in the electrophotographic image forming apparatus is sometimes adversely affected in the sensor operation by a fine particle such as an extra toner and the like generated in the vicinity of the photosensitive drum.

Particularly, in the potential sensor of a shutter structure having an opening, if the interval between the detection electrode and the shutter is from several μm to hundreds μm, the fine particle such as the toner and the like infiltrates into the space between the detection electrode and the shutter, and is apt to adversely affect the sensor operation. To enhance reliability of the sensor, a structure having no such opening is preferable.

Further, in the conventional potential sensor, the measurable area of the measuring object is approximately the same as the area of the detection electrode, and it is difficult to measure a distribution of potential of the measuring object having the area larger than the detection electrode.

In view of the above-described problems, the object of the present invention is to provide an electric potential measuring device and an image forming apparatus which are excellent in realizing a downsizing, a high performance, an advanced and sophisticated features, and a high reliability, and easily able to constitute a structure difficult to be affected by contamination such as a fine particle and measure the electric potential of an object to be measured as the measuring object.

DISCLOSURE OF THE INVENTION

According to an aspect of the present invention, there is provided an electric potential measuring device comprises: a detection electrode comprised of a conductive material and disposed in opposition to an object to be measured; a movable structure comprised of a first solid material portion comprised of a dielectric and a second solid material portion comprised of a material having a relative dielectric constant different from the dielectric or a conductive material and disposed so as to come to the object to be measured side of the detection electrode; and a drive mechanism for moving the movable structure in such a way as to change a positional relationship of the first and second solid material portions for the detection electrode in an area between the detection electrode and the object to be measured, wherein a charge induced on the detection electrode by electric lines of force emanating from the object to be measured is modulated by moving the movable structure by the drive mechanism, to measure an electric potential of the object to be measured. In such constitution, the shape of the structure hardly receives restrictions, and it is possible to adopt a simple shape. Hence, the effecting of a downsizing, a high performance and advanced and sophisticated features of the potential sensor can be easily dealt with, and furthermore, the device can be made into a structure difficult to be affected by contamination and a fine particle. The movable structure is preferably a sheet-shaped structure.

In the electric potential measuring device of the above-described invention, the detection electrode is preferably formed on a substrate disposed in opposition to the object to be measured, and the movable structure is periodically movable in a surface parallel to the substrate just above the surface of the object to be measured side of the detection electrode. In this shape, a publicly known mechanism can be used as a drive mechanism of the structure, and further, the signal generated by a signal detection electrode can be processed without imposing a large load on a signal processing circuit.

In the electric potential measuring device of the above-described invention, the second solid material portion is preferably shaped periodically in a predetermined direction, and an insulator layer is formed on the detection electrode, and an electric conductor layer of a shape having the same direction and the same periodic length as the second solid material portion is formed on the insulator layer (see FIG. 1). Although a mutual disposition of the first solid material portion and the second solid material portion of the structure can be appropriately designed in conformity to use application, in this shape, a dynamic range can be made larger, and the potential sensor excellent in sensitivity, performance and reliability can be easily realized.

In the electric potential measuring device of the above-described invention, the second solid material portion is preferably shaped periodically in a predetermined direction, and an electric conductor layer of a shape having the same direction and the same periodic length as the second solid material portion is formed on the detection electrode through an insulator layer, and no insulator layer exists in a part in which the electric conductor layer is not formed but the detection electrode is exposed (see FIG. 11). Even in such structure, the potential sensor being excellent in sensitivity, performance and reliability can be easily realized.

In the electric potential measuring device of the above-described invention, the second solid material portion is preferably shaped periodically in a predetermined direction, and the detection electrode is formed in a shape having the same direction and the same periodic length as the second solid material portion. The electric conductor layer of a shape having the same direction and the same periodic length as the second solid material portion is preferably formed on a portion in which the detection electrode is not formed through an insulator layer. (see FIG. 12). The shape of the detection electrode preferably has a divided structure, and is preferably constituted such that a signal generated by each of the divided detection electrode can be independently measured and processed (see FIGS. 17A, 17B and 17C). If this shape is used, it is possible to measure the distribution of the potential of a larger area (for example, a length of a longer direction of A4 is about 30 cm). Further, after having discriminated a detected electric potential strength, by adding and amplifying the signals of a plurality of detection electrodes adjacent to one another, it is possible to broaden the range of a measurable potential level. As for the signal detection electrode of the divided structure, a shape formed in a shape simpler than the second solid material portion is also possible (see FIG. 19).

In view of the performance, the second solid material portion is preferably comprised of the conductive material, and the conductive material is preferably grounded so that the electric lines of force are shielded by the second solid material portion.

According to another aspect of the present invention, there is provided an image forming apparatus which comprises the above electric potential measuring device and an image forming means for performing a control of an image formation by using the electric potential measuring device. The image forming means has, for example, a copy function, a printing function or a facsimile function. The present image forming apparatus has the image forming means to carry a photosensitive drum, and can take a shape to measure a charge potential on the photosensitive drum by using the electric potential measuring device. This will be specifically described by using FIG. 21. FIG. 21 is a schematic illustration of the periphery of the photosensitive drum of an electrophotographic developing apparatus using the potential sensor according to the present invention. In the periphery of a photosensitive drum 708, there are installed an electrostatic charger 702, an electric potential sensor 701, an exposing machine 705, and a toner feeder 706. The surface of the drum 708 is charged by the electrostatic charger 702, and the surface of the photosensitive drum 708 is exposed by the exposing machine 705, so that a latent image is obtained. The latent image is adhered with the toner by the toner feeder 706 so that a toner image is obtained. Further, the toner image is transferred on a transferred object 709 held between a transferred object feed roller 707 and the photosensitive drum 708, and the toner on the transferred object is adhered. By going through these steps, the image formation is achieved. The charged state of the drum 708 is measured by the potential sensor 701, and the signal is processed by a signal processor 703. A high voltage transformer 704 is applied with a feedback to control the electrostatic charger 702 so that a steady drum charge is realized, and a steady image formation is realized.

According to a further aspect of the present invention, there is provided an electric potential measuring method comprising the steps of: preparing a detection electrode comprised of a conductive material and disposed in opposition to an object to be measured; a movable structure comprised of a first solid material portion comprised of a dielectric and a second solid material portion comprised of a material having a relative dielectric constant different from the dielectric or a conductive material and disposed so as to come to the object to be measured side of the detection electrode; and moving the movable structure in such a way as to change a positional relationship of the first and second solid material portions for the detection electrode in an area between the detection electrode and the object to be measured, whereby a charge induced on the detection electrode by electric lines of force emanating from the object to be measured is modulated, to measure an electric potential of the object to be measured.

Figure 1:
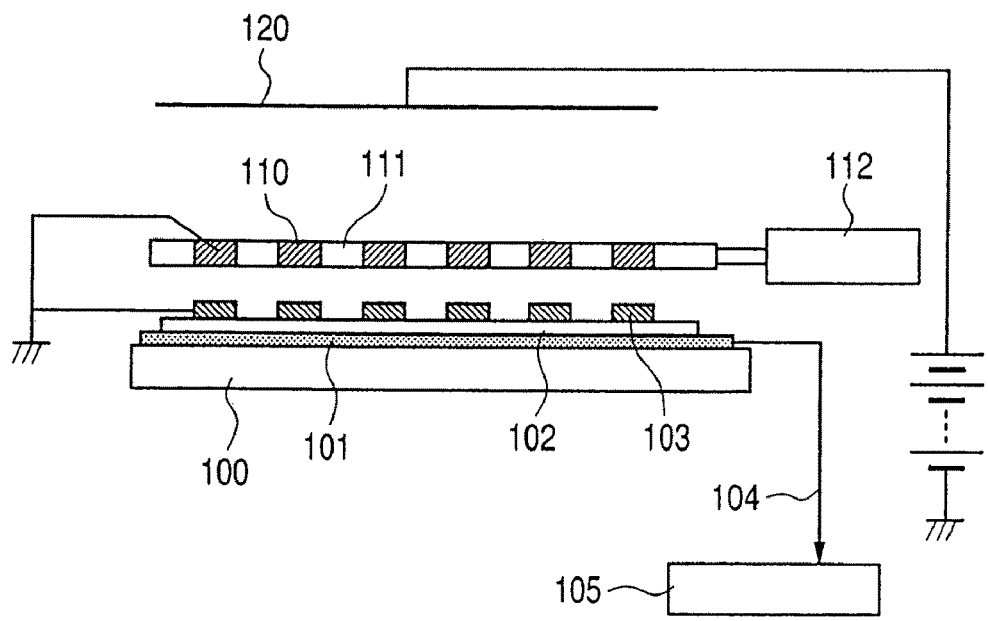
FIG. 1 is a sectional view showing a positional relationship between an object to be measured and a substrate assembly and the movable structure comprising an electric potential sensor in a first embodiment of the present invention.

According to the present invention, the movable structure, which is preferably a sheet-shaped one (whereinafter referred to as a "sheet-shaped structure"), comprised of the first solid material portion comprised of a dielectric and the second solid material portion comprised of a material having a relative dielectric constant different from the first solid material portion or a conductive material is moved between an electrode detecting a signal and the object to be measured, thereby modulating a charge induced on the detection electrode by electric lines of force from the object to be measured and measuring the potential of the object to be measured. As a result, with any restriction scarcely received on the shape of the sheet-shaped structure, it is easy to effect a downsizing, a high performance and advanced and sophisticated features of the potential measuring device, and the potential measuring device of a structure difficult to be affected by contamination such as a fine particle can be realized.

BEST MODE FOR CARRYING OUT THE INVENTION

Embodiments of the present invention will be described in detail below with reference to the drawings. Throughout the drawings, the same reference numerals are attached to equivalent portions.

First Embodiment

A first embodiment of the present invention will be described based on FIGS. 1 to 6. FIG. 1 shows a whole structure of an electric potential sensor according to the present embodiment. In FIG. 1, a detection electrode 101 and an insulator layer 102 are formed on a planar substrate 100, and an electric conductor layer 103 periodically disposed in a predetermined direction (here, the left and right directions of the drawing) is disposed on the surface of the insulator layer 102 (hereinafter, a portion comprised of the detection electrode, the insulator layer and the electric conductor layer is referred to as "substrate assembly"). In the vicinity of this substrate assembly, a sheet-shaped structure, in which a second solid material portion 110 comprised of a conductive material is disposed in a striped shape (see FIG. 5) in the same direction and the same cycle length as the periodic disposition of the electric conductor layer 103 and a first slid material portion 111 comprised of dielectric material is disposed between the second solid material portions 110, is disposed so as not to physically contact the substrate assembly. The sheet-shaped structure is disposed so as to come between the substrate assembly and an object to be measured 120 when the substrate assembly is disposed in opposition to the object to be measured 120. The sheet-shaped structure is movable to the predetermined direction in parallel with the planer substrate assembly as a whole by a drive mechanism 112.

The detection electrode 101 is electrically connected to a signal detection circuit 105 by a wiring 104. Each electric conductor layer 103 and each second solid material portion 110 are grounded.

FIG. 1 shows a state in which the position of each second solid material portion 110 of the sheet-shaped structure and the position of each electric conductor layer 103 inside the substrate assembly are in an almost aligned state for the object to be measured 120. In contrast to this, in FIG. 2, the sheet-shaped structure is in a state of having been moved by half a distance of the period length of the disposition of the second solid material portion 110 from a state of FIG. 1 by operating the drive mechanism 112. Consequently, the position of each second solid material portion 110 and the position of each portion of the detection electrode 101 in which the electric conductor layer 103 is not formed are in an almost aligned state for the object to be measured 120.

Figure 2:
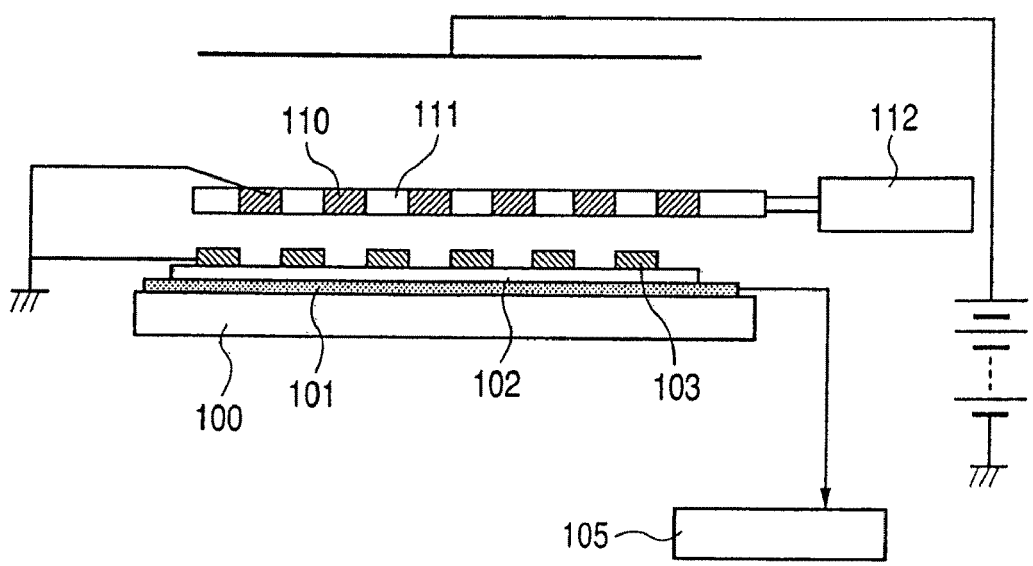
FIG. 2 is a sectional view showing the positional relationship between each component part and the object to be measured when the structure is moved from the position of FIG. 1 in the first embodiment.

The operation of the potential sensor constituted as above will be described. When a voltage is applied to the object to be measured 120, the electric lines of force emanating from the object to be measured 120 are shielded by the second solid material portion 110, but reaches the detection electrode 101 located between the electric conductor layers 103 through the first solid material portion 111, thereby generating a charge here. At this time, the case where a relative position between the sheet-shaped structure and the substrate assembly is in the relationship as shown in FIG. 1 and the case where the relative position is in the relationship as shown in FIG. 2 are different in a volume of electric field in which the detection electrode 101 is exposed, and in the charge induced on the detection electrode 101, accordingly. The charging and discharging of this induced charge is turned into a current, a voltage and the like, and is measured by a signal detection circuit 105. As for the method for detecting the voltage, there is available a passive method in which the measurement is made by using a voltage drop by a known resistor. Further, there is available an active zero method for adjusting the potential of the electric conductor layer 103 and the like so as to make a charging and discharging current generated in the detection electrode zero, by using a potential adjusting element circuit, thereby measuring the potential of the object to be measured. In case of using this active zero method, the electric conductor layer 103 and the like are not grounded to earth, but connected to the potential adjusting element circuit.

Figure 3:
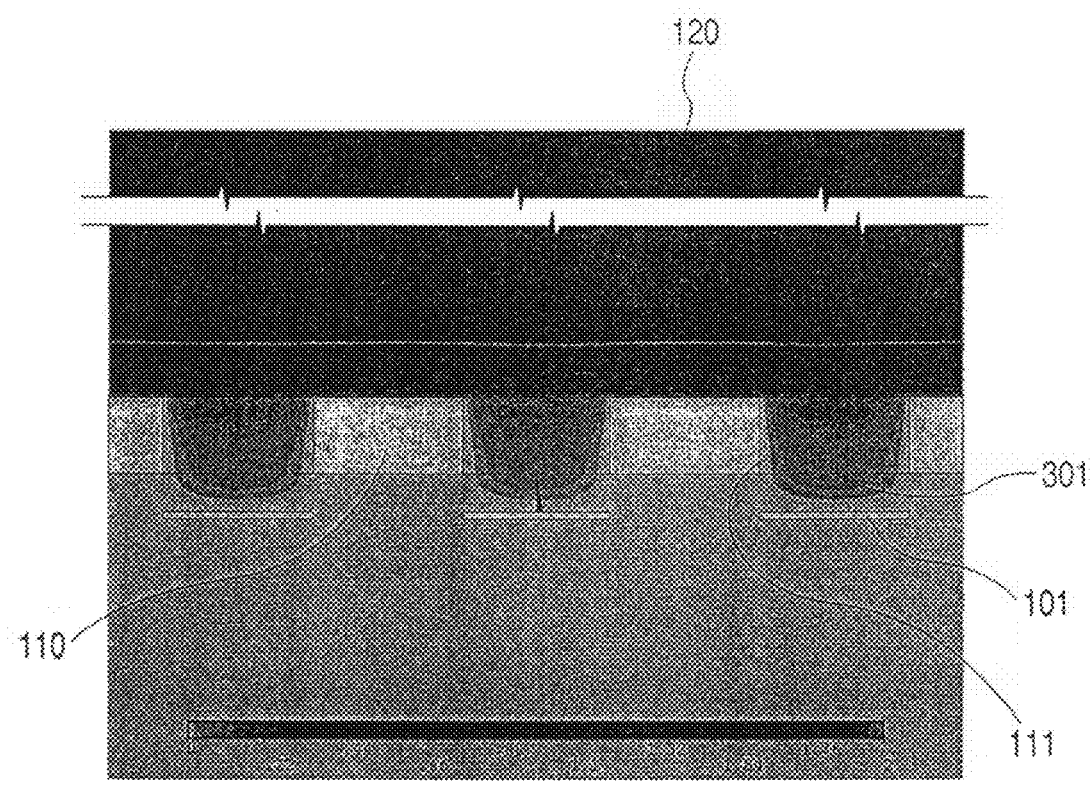
FIG. 3 is a view showing that a numerical analysis of a potential distribution state in the vicinity of a substrate assembly and a structure shown in FIG. 1 is performed when a voltage is applied to the object to be measured.
Figure 4:
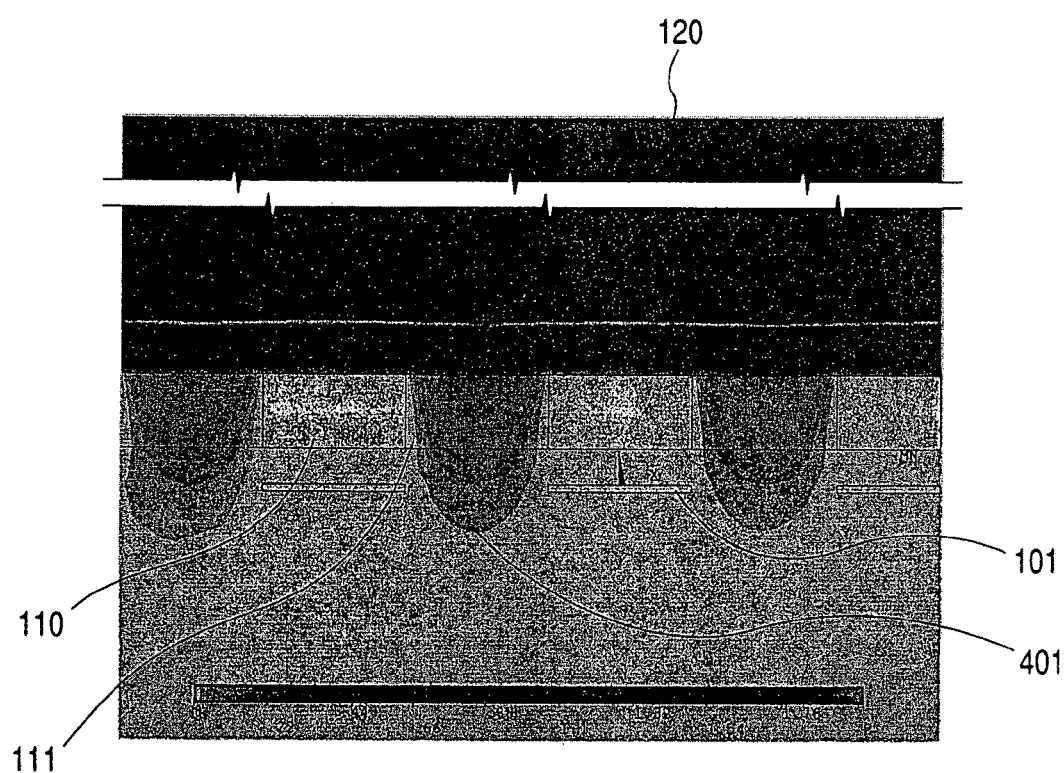
FIG. 4 is a view showing that the numerical analysis of the potential distribution state in the vicinity of the substrate assembly and the structure shown in FIG. 2 is performed when the voltage is applied to the object to be measured.

FIGS. 3 and 4 represent the result of a numerical analysis of a state in which the electric lines of force reach the detection electrode through the first solid material portion 111 of a sheet-shaped structure, respectively, when a voltage is applied to the object to be measured 120 in the state of FIGS. 1 and 2. The numerical analysis is performed by using a simplified analyzing model.

In FIGS. 3 and 4, the sheet-shaped structure having a thickness of 10 μm is installed 3 mm downward from the object to be measured 120. The sheet-shaped structure is comprised of a first solid material portion 111 comprised of a dielectric and a conductive material, and is comprised of a second solid material portion 110 electrically grounded, and these are alternately disposed in a period of 40 μm. Further, the detection electrode 101 in the analyzing model is installed 5 μm downward from the first solid material portion 111.

In FIG. 3 corresponding to the state of FIG. 1, the voltage of 800 V is applied to the object to be measured 120, and the electric lines of force radiated from the object to be measured reach the detection electrode 302 through the first solid material portion 111. At this time, contour plot of equipotential lines joining the points having the equal potential in the space between the object to be measured 120 and the detection electrode 101 is represented by black and white shadings pattern as shown by 301 in FIG. 3. However, in FIG. 3, a state only in which the potential changes from 0 V to 2 V in the space in the vicinity of the sheet-shaped structure and the detection electrode is represented.

Even if the sheet-shaped structure having no region such as a physical "hole" is inserted between the object to be measured 120 and the detection electrode 101 from FIG. 3, it is understood that the electric lines of force reach the detection electrode through the dielectric on the condition that a part of the sheet-shaped structure is comprised of a dielectric. Furthermore, it is also understood that the location of the electric lines of force passing through the sheet-shaped structure can be controlled by constituting the sheet-shaped structure by appropriately combining the conductive portion 110 and the dielectric portion 111.

FIG. 4 represents the result of performing the numerical analysis on the state of FIG. 2. Here, the sheet-shaped structure moves for the detection electrode by a half of the length of the period length 40 μm of the disposition of the second solid material portion 110 and the first solid material portion 111, that is, by 20 μm in the right or the left direction of the drawing, and as a result the detection electrode 101 is located down below the second solid material portion 110. At this time, contour plot of equipotential lines formed by the electric lines of force radiated from the object to be measured 120 are represented by 401.

As evident from FIGS. 3 and 4, a change in a relative position between the first solid material portion 111 comprised of the dielectric and the detection electrode 101 changes the potential in the periphery of the detection electrode 101, thereby changing the number of electric lines of force reaching a detection electrode 101 to change the charge induced on the detection electrode 101.

Accordingly, as shown in FIGS. 1 and 2, if the sheet-shaped structure wherein the first solid material portion 111 and the second solid material portion 110 are periodically disposed is inserted between the object to be measured 120 and the detection electrode 101 and the sheet-shaped structure is periodically moved, the charge induced on the detection electrode 101 can be modulated, and based on this, it is possible to detect a surface potential of the object to be measured 120 by signal detection circuit 105.

Figure 5:
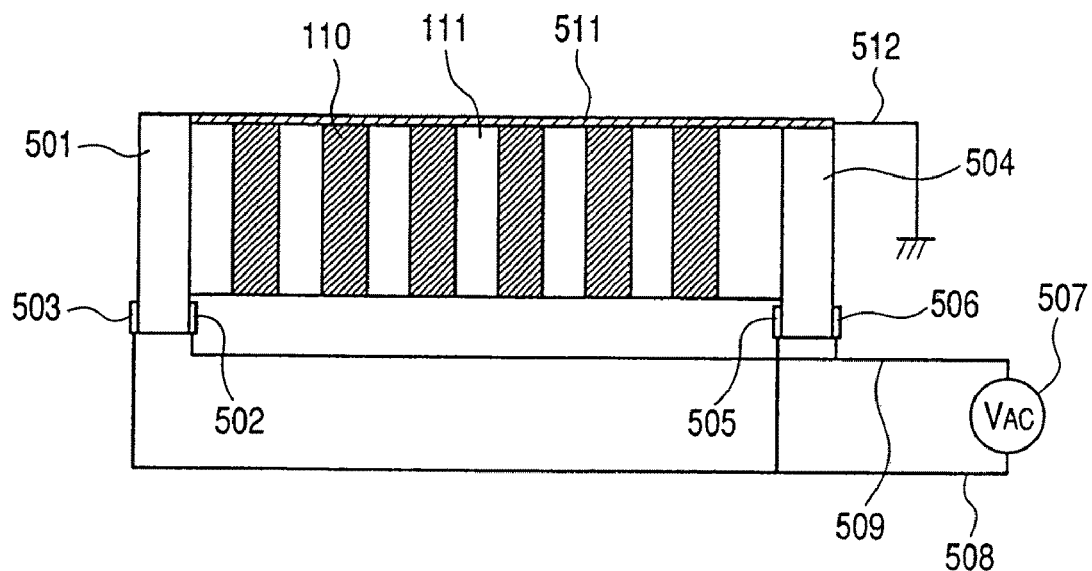
FIG. 5 is a top view showing the structure and a mechanism for driving the structure in the first embodiment.

Here, the drive mechanism 112 of the potential sensor of the present embodiment and the disposition of each component part will be described by using the top views of FIGS. 5 and 6. As shown in FIG. 5, both ends of a vibration direction of the sheet-shaped structure are connected to a piezoelectric element 501 in which electrodes 502 and 503 are formed, and a piezoelectric element 504 in which electrodes 505 and 506 are formed. A synchronous alternating current voltage is applied to a group of electrodes 502 and 503 and a group of electrodes 505 and 506 through wirings 508 and 509 from a piezoelectric element-driving power source 507 so as to vibrate both of the piezoelectric elements. As a result, the position of the sheet-shaped structure is moved.

Further, in FIG. 5, the second solid material portion 110 is grounded by an earth wiring 511 and an electric wiring 512. In this way, the electric lines of force are satisfactorily shielded in the second solid material portion 110.

Figure 6:
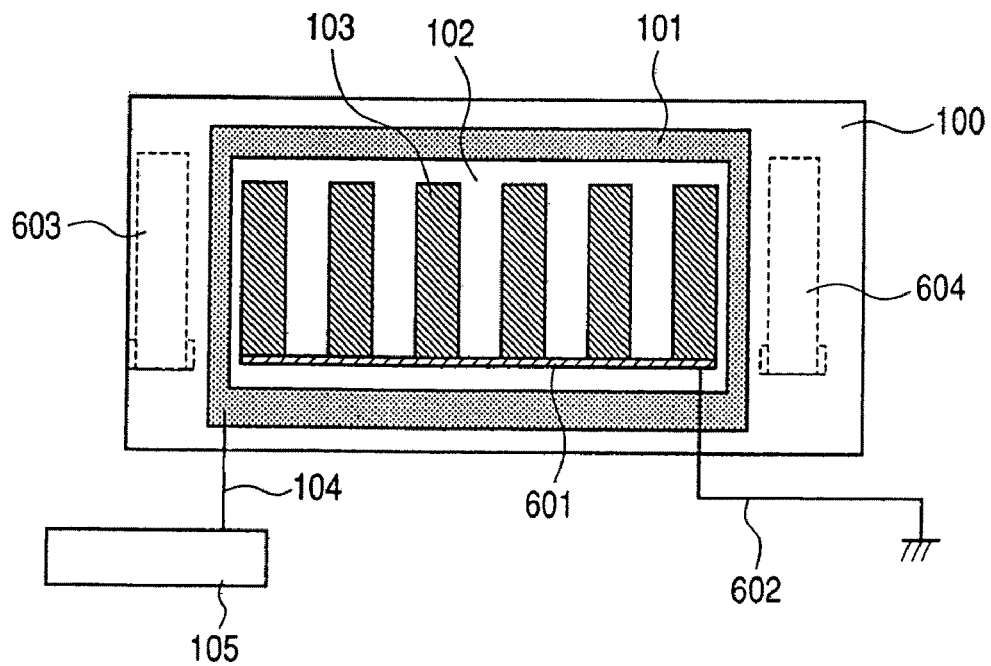
FIG. 6 is a top view showing an area provided on the substrate assembly in order to install the driving mechanism of the structure in the first embodiment.

FIG. 6 shows a substrate assembly for disposing the sheet-shaped structure and the piezoelectric elements 501 and 504 shown in FIG. 5. The detection electrode 101, insulator layer 102 and electric conductor layer 103 are disposed in a substrate 100. Further, the electric conductor layer 103 is grounded by electric wirings 601 and 602 so that the shielding of the electric lines of force coming here is satisfactorily performed to control a noise component of the potential sensor. The detection electrode 101 is connected to the signal detection circuit 105 by a signal wiring 104. Space regions 603 and 604 for installing the piezoelectric elements 501 and 504 are secured on the substrate 100, and these piezoelectric elements are mounted on these space regions. At this time, it is easy to dispose the sheet-shaped structure in such a way not to contact a substrate assembly by appropriately executing a method for connecting the piezoelectric elements 501 and 504 to the sheet-shaped structure.

As for the drive mechanism of the sheet-shaped structure, the other publicly known drive mechanism utilizing a static electricity, a magnetic field, heat, an electromagnetic force may be used.

Second Embodiment

Figure 7:
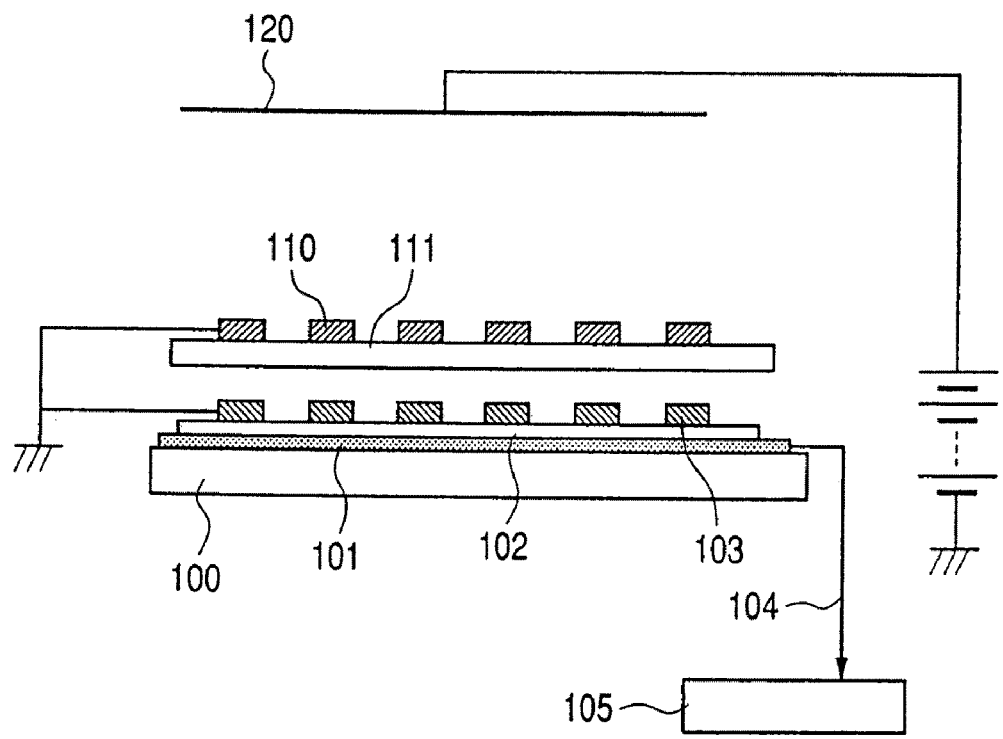
FIG. 7 is a sectional view showing a second embodiment of the present invention.

Next, a second embodiment of the potential sensor of the present invention will be described by using FIGS. 7 to 10. FIG. 7 represents a sectional schematic illustration of the present embodiment in which the structure of a sheet-shaped structure is different comparing to the first embodiment. In the present embodiment, a second solid material portion 110 comprised of a thin film conductive material on a first solid material portion 111 which is comprised of one sheet of a sheet-shaped dielectric is periodically disposed in a striped shape (see FIG. 8) in a predetermined direction. This structure is easy to prepare. The other constitutions are the same as the first embodiment.

Figure 8:
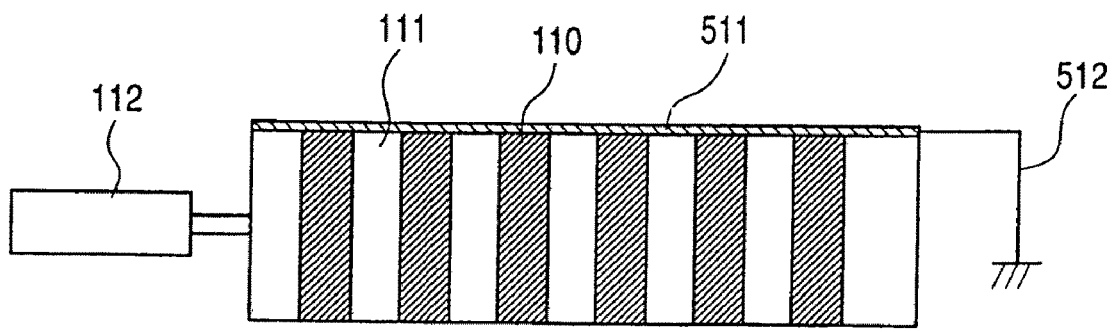
FIG. 8 is a top view showing the structure in the second embodiment.

FIG. 8 represents a top view of the sheet-shaped structure shown in FIG. 7. The second solid material portion 110 is disposed in a striped shape, and is electrically grounded through wirings 511 and 512. The sheet-shaped structure can periodically move in the predetermined direction on a substrate assembly by a drive mechanism 112 connected to a first solid material portion 111.

Figure 9:
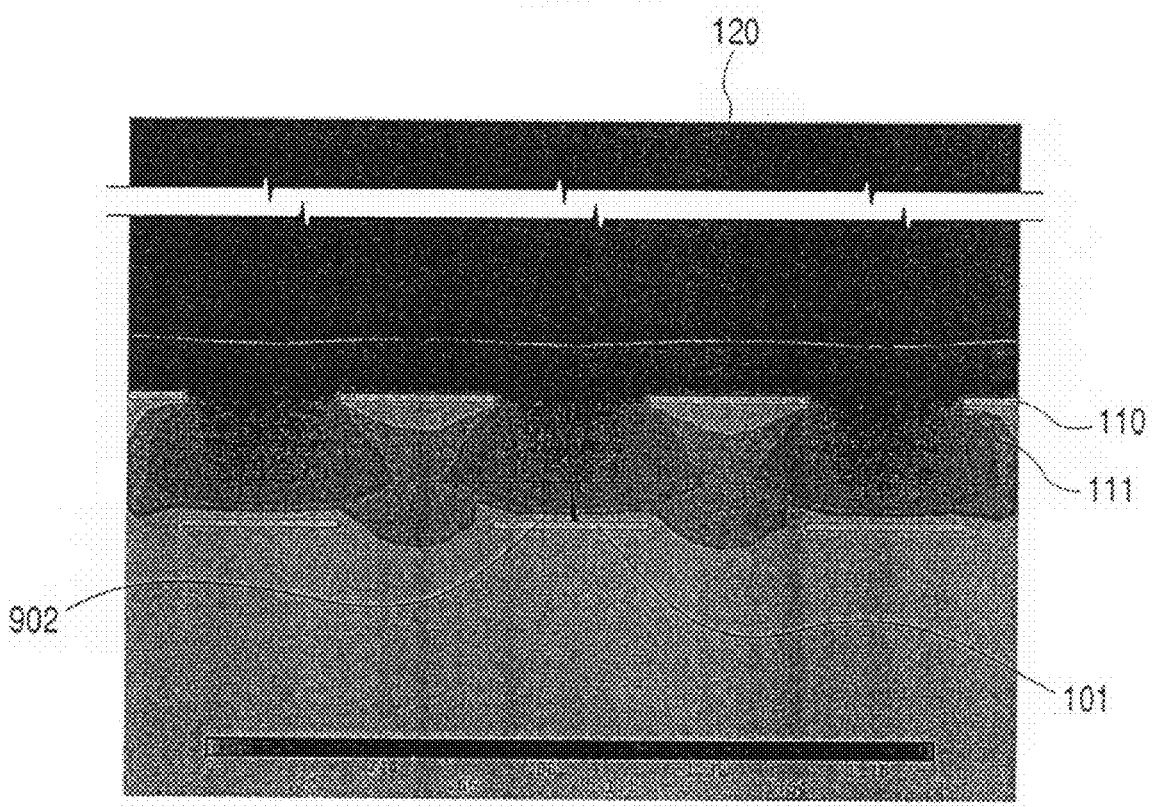
FIG. 9 is a view showing that the numerical analysis of the potential distribution state in the vicinity of the substrate assembly and the structure is performed when the voltage is applied to the object to be measured in the second embodiment.
Figure 10:
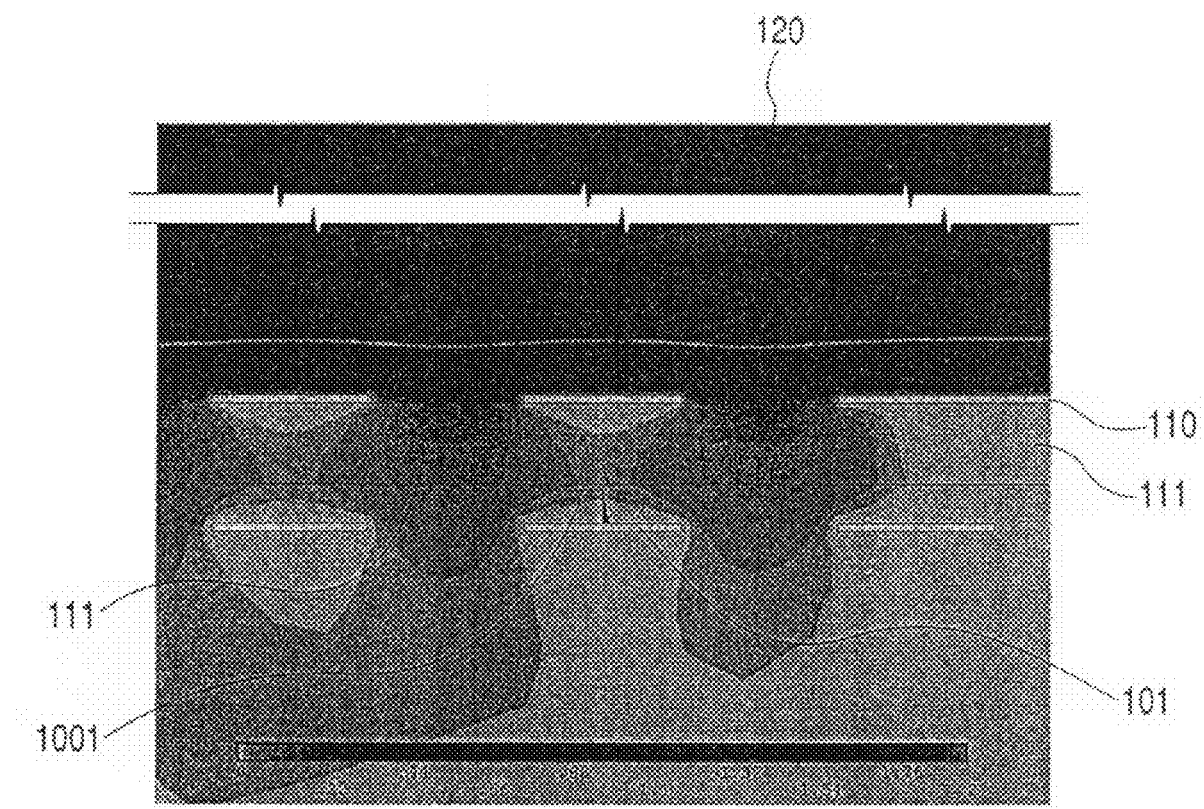
FIG. 10 is a view showing that the numerical analysis of the potential distribution state in the vicinity of the substrate assembly and the structure is performed when the position of the structure is moved to a position different from FIG. 9 in the event that the voltage is applied to the object to be measured in the second embodiment.

FIGS. 9 and 10 represent an analyzing model and a calculation result in case of numerically analyzing the present embodiment shown in FIG. 7. A first solid material portion 111 having a thickness of 10 μm is disposed 3 mm downward from an object to be measured 120, and the second solid material portion 110 having a thickness of 1 μm and a width of 20 μm is disposed in a period of 40 μm above the first solid material portion 111. Further, the detection electrode 101 in the analyzing model is disposed 5 μm below from the first solid material portion.

In FIG. 9, a voltage of 800 V is applied to the object to be measured 120, and electric lines of force radiated from the object to be measured reach the detection electrode 101 through the first solid material portion 111. In this case, contour plot of equipotential lines of the space between the object to be measured 120 and the detection electrode 101 are represented by black and white shadings. They are shown by shapes as shown by 902 of FIG. 9. In FIG. 9 similarly as FIG. 3, a state only in which the potential changes from 0 V to 2 V in the space in the vicinity of the sheet-shaped structure and the detection electrode 101 is represented due to a limit of the drawing. As evident from FIG. 9, even in the constitution in which the sheet-shaped structure is comprised of the second solid material portion 110 periodically disposed on the first solid material portion 111 and its surface, the electric lines of force radiated from the object to be measured 120 are shielded in a part in which the second solid material portion 110 exists. However, in a part in which the second solid material portion does not exist but the first solid material portion 111 only exists, it is possible for the electric lines of force to reach the detection electrode 101 through the first solid material portion.

FIG. 10 represents a distribution of the potential in a state in which the sheet-shaped structure is moved from the state in FIG. 9 to the right or the left direction of the drawing for the detection electrode 101 by 20 μm, that is, by half a distance of the disposition period of the second solid material portion 110. A potential distribution 1001 above the detection electrode 101 is evidently different from a potential distribution 902 of FIG. 9, and from this, it is understood that a charge induced by an electric field from the object to be measured 120 and appeared on the detection electrode 101 is different between the states of FIGS. 9 and 10.

Consequently, it is understood that the sheet-shaped structure shown in FIGS. 7 and 8 also enables the charge induced on the detection electrode 101 to be modulated by periodically moving the sheet-shaped structure.

Third Embodiment

Figure 11:
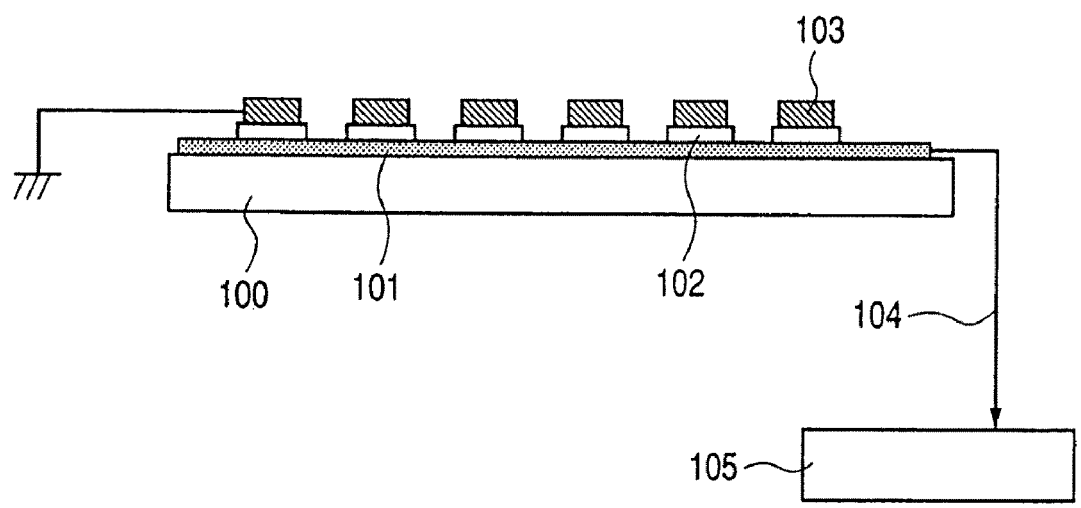
FIG. 11 is a sectional view showing the structure of the substrate assembly in a third embodiment of the present invention.

Next, a third embodiment of the potential sensor of the present invention will be described with reference to FIG. 11. In the third embodiment, the structure of a substrate assembly is different, comparing to the first and the second embodiments. An insulator layer 102 has the same periodic structure as an electric conductor layer 103 periodically disposed and is disposed directly below the layer 103. A detection electrode 101 formed on a substrate 100 is periodically exposed in the space of an object to be measured side through a clearance gap of the insulator layers 102. This constitution also enables a charge induced on the detection electrode 101 to be modulated, and similarly as the above-described embodiment, the potential of the object to be measured to be measured.

Fourth Embodiment

A fourth embodiment of the potential sensor of the present invention will be described with reference to FIGS. 12 and 13. In a substrate assembly of FIG. 12, one insulator layer 102 is formed on a substrate 100, and an electric conductor layer 103 is periodically disposed on the layer 102. Between the electric conductor layers 103, the detection electrode 101 is formed directly on the substrate 100, and there exists no insulator layer 102. That is, the detection electrodes 101 are separated from each other by the insulator layer 102, and do not exist just under the insulator layer 102. Further, there exists neither insulator layer 102 nor the electric conductor layer 103 on the detection electrode 101, and the detection electrodes are periodically exposed in the space of the object to be measured side through intervals of the insulator layers 102.

Figure 12:
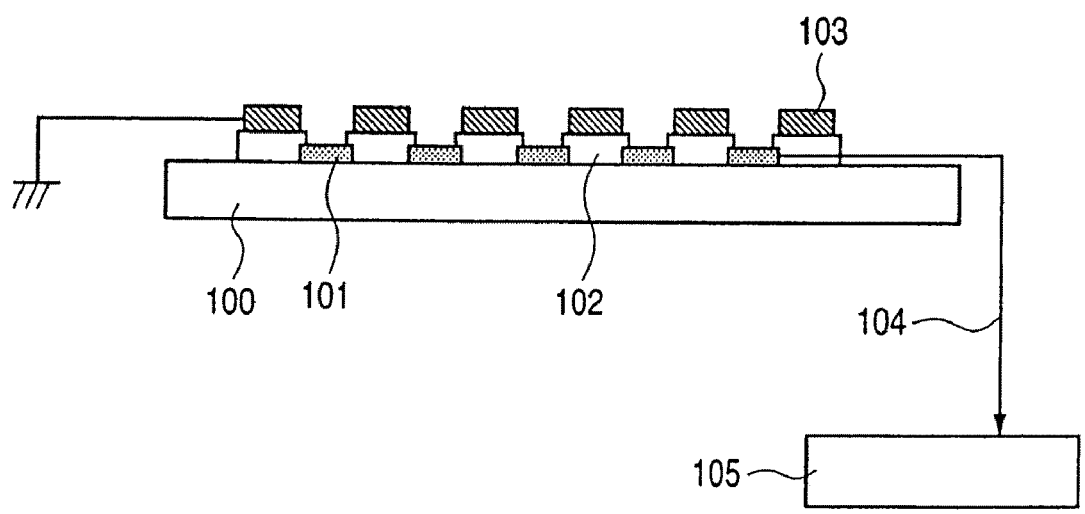
FIG. 12 is a sectional view showing the structure of the substrate assembly in a fourth embodiment of the present invention.
Figure 13:
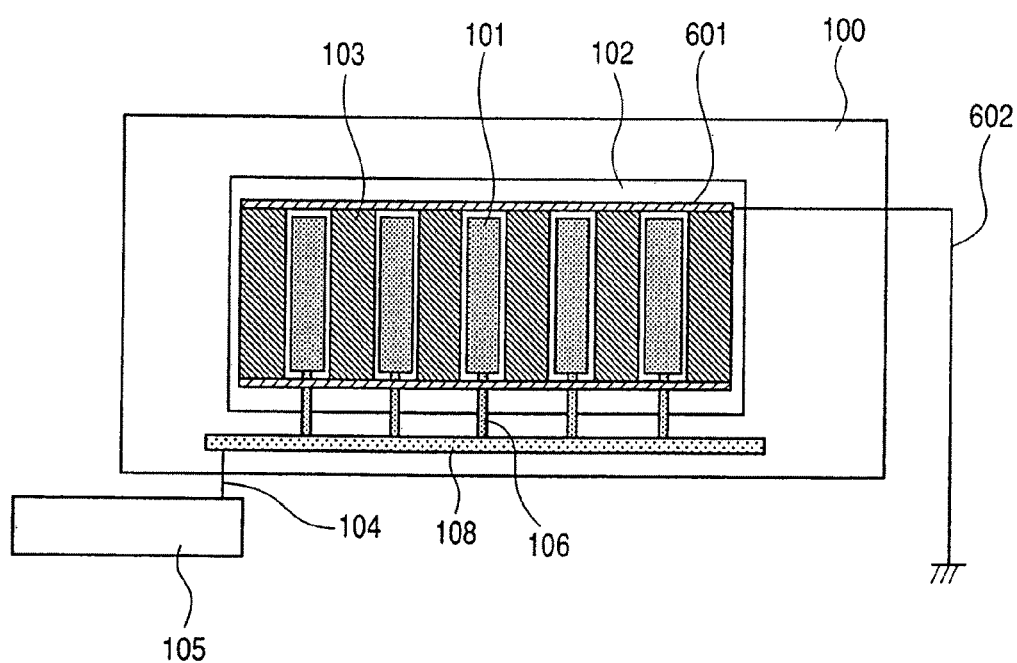
FIG. 13 is a top view of a structure of the substrate assembly seen from above in the fourth embodiment of the present invention.

FIG. 13 is a view observing FIG. 12 from above. The rectangular detection electrodes 101 are disposed on the substrate in a plurality of window portions provided in the insulator layer 102 on the substrate 100, and are shaped so as to be exposed in the space of the object to be measured side, and further, shielded at both sides thereof by the electric conductor layers 103 which are grounded. In this way, similarly as the above-described embodiment, the electric lines of force from the object to be measured reach the detection electrode 101 almost directly from the front side only, and it is, therefore, possible to control a noise component and measure an accurate potential.

In this structure, the signals generated at each detection electrode 101 by the periodic movement of the sheet-shaped structure are transmitted to the signal detection circuit 105 through the wirings 106, 108 and 104 held between the insulator layer 102 and the substrate 100.

Figure 14:
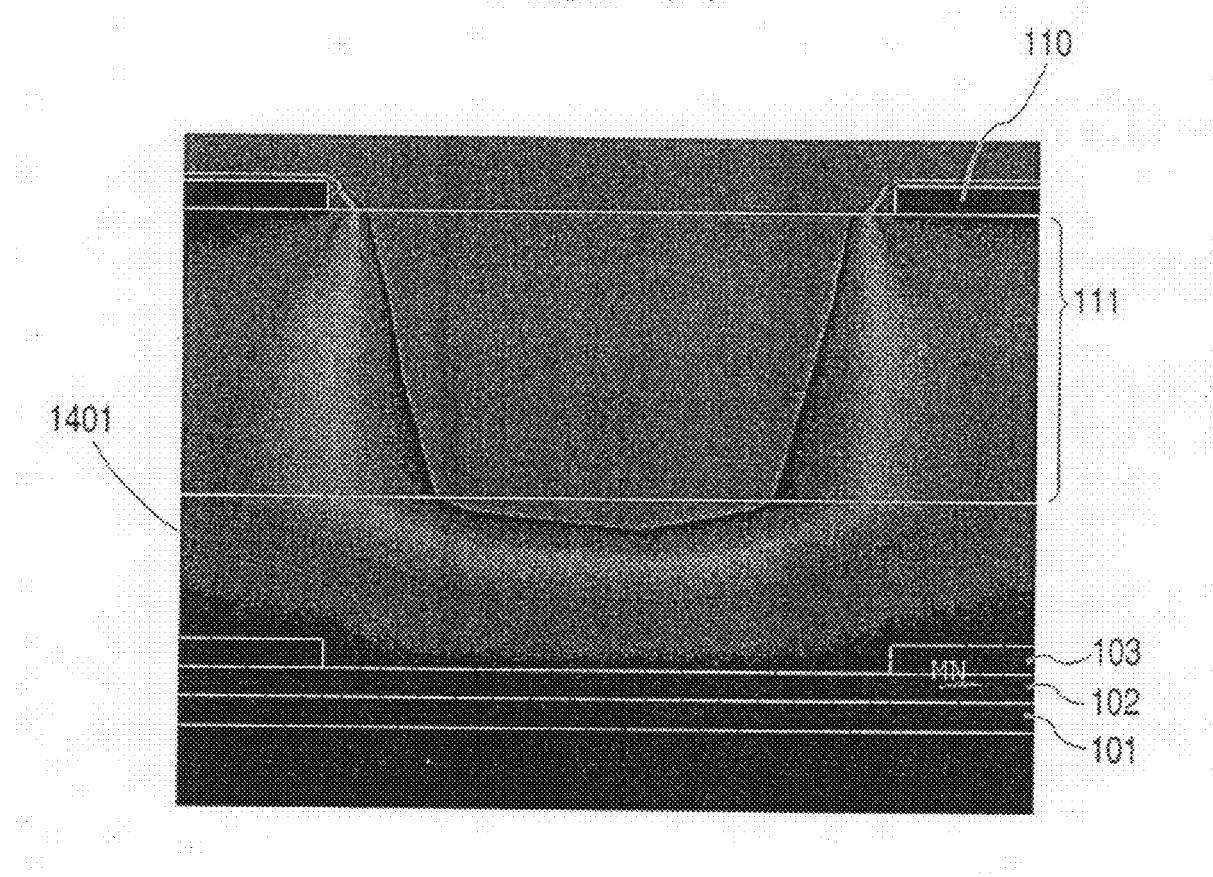
FIG. 14 is a view showing that the numerical analysis of the potential distribution state in the vicinity of the substrate assembly and the detection electrode of the structure is performed when the voltage is applied to the object to be measured in the second embodiment of the present invention.
Figure 15:
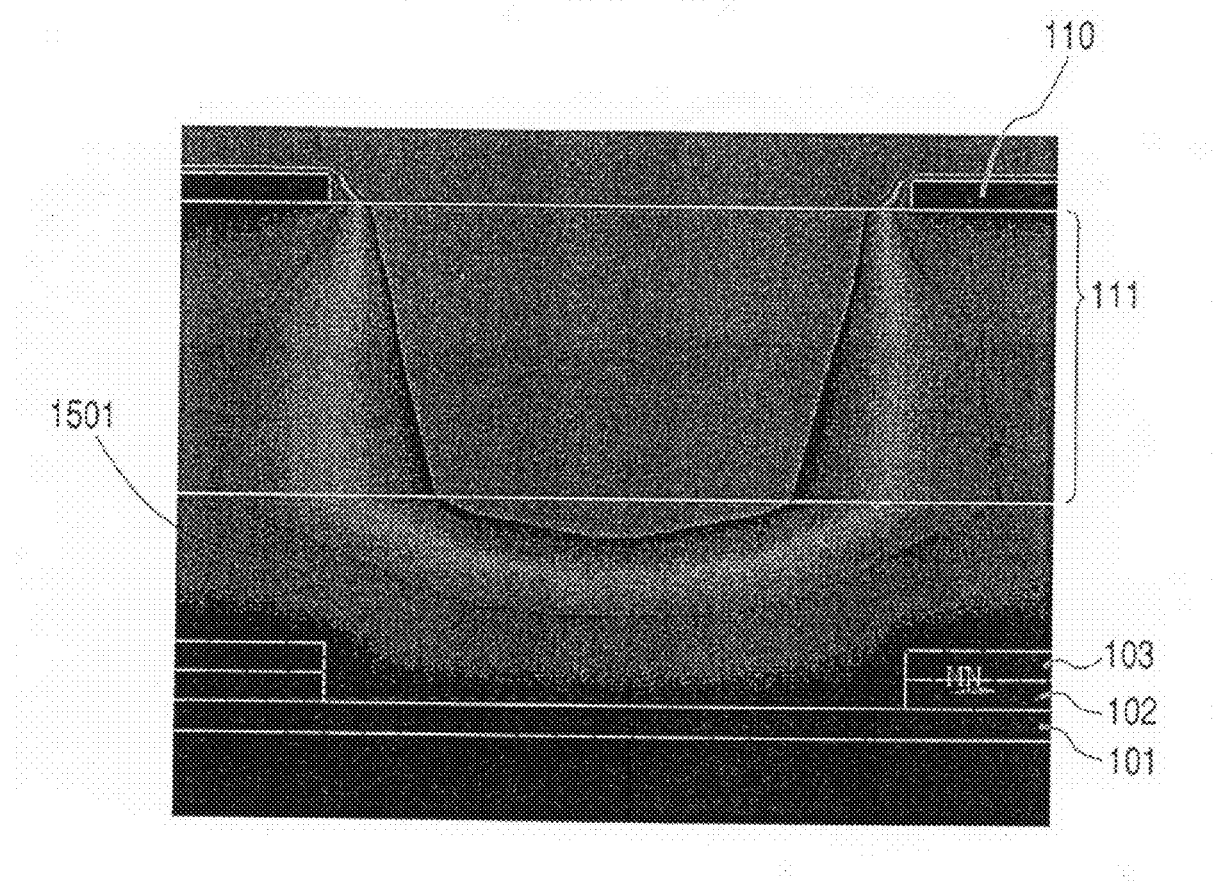
FIG. 15 a view showing that the numerical analysis of the potential distribution state in the vicinity of the substrate assembly and the detection electrode of the structure is performed when the voltage is applied to the object to be measured in the third embodiment of the present invention.
Figure 16:
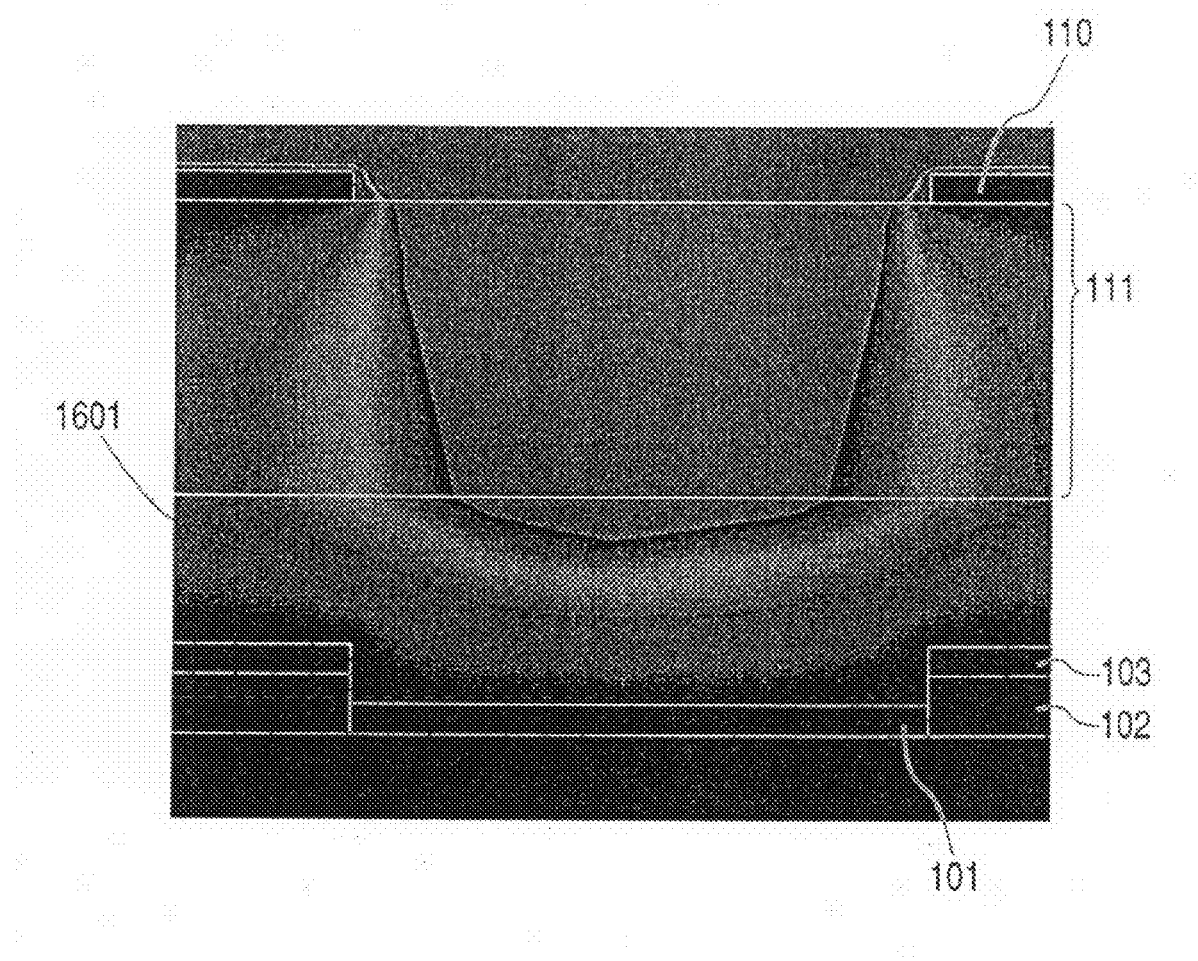
FIG. 16 a view showing that the numerical analysis of the potential distribution state in the vicinity of the substrate assembly and the detection electrode of the structure is performed when the voltage is applied to the object to be measured in the fourth embodiment of the present invention.

FIGS. 14, 15 and 16 show a result of numerical analysis of the distribution in the vicinity of the detection electrode of the electric field emanating from the object to be measured when three types of the substrate assembly as described in the second, third and fourth embodiments are used together with the sheet-shaped structure in the second embodiment. In this analysis, a voltage of 800 V is applied to the object to be measured, and the first solid material portions 111 having a thickness of 10 μm are disposed 3 mm downward from the object to be measured, and the second solid material portions 110 having a thickness of 1 μm and a width of 20 μm are disposed on the first solid material portion 111 in a periodic pattern of 40 μm. Each substrate assembly is disposed 5 μm below from this sheet-shaped structure. Equipotential distributions 1401, 1501 and 1601 are represented by black and white shadings in the rage of 0 V to 0.1 V due to a limit of the drawings.

From FIGS. 14, 15 and 16, it is easily understood that, in any one of three types of the substrate assembly structure used in the second, third and fourth embodiments, respectively, the electric potential distribution is generated in the vicinity of the detection electrode 101, and each is a structure usable as a potential detection electrode of the potential sensor.

Further, it is understood that the case where the insulator layer 102 is available on an exposed detection electrode (second embodiment, FIG. 14) and the case where the layer is not available (the third embodiment, FIG. 15, the fourth embodiment, FIG. 16) are different in potential distribution of the surface of the detection electrode 101. Hence, it is possible to change the disposition of the electric conductor layer, the insulator layer and the detection electrode so as to be able to obtain an optimum potential distribution according to a use application and a design of the substrate assembly.

Fifth Embodiment

Figure 17A:
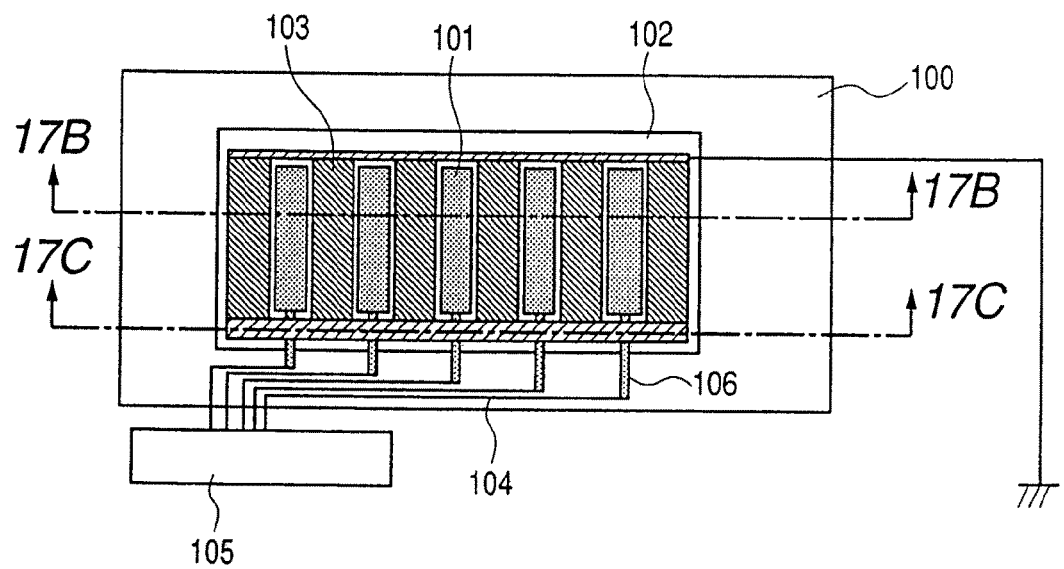
FIG. 17A is a top view showing a constitution of the substrate assembly in a fifth embodiment of the present invention.
Figure 17B:
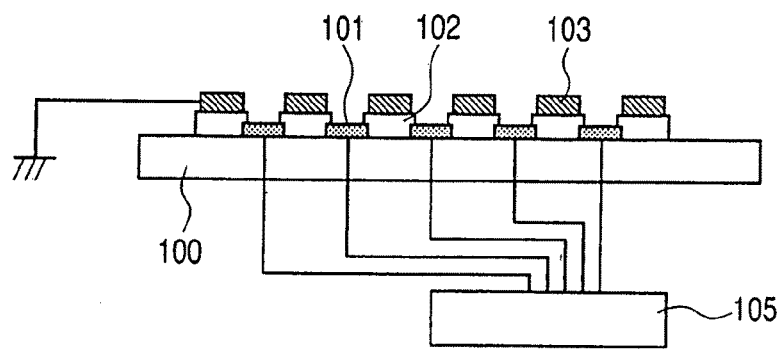
FIGS. 17B and 17C are views showing sections cut in the lines 17B-17B and 17C-17C in FIG. 17A, respectively.
Figure 17C:
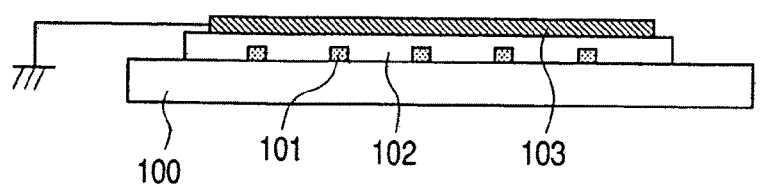

Next, a fifth embodiment of the present invention will be described with reference to FIGS. 17A, 17B and 17C. FIG. 17A is a top view of a substrate assembly structure in the fifth embodiment. FIGS. 17B and 17C are views showing sections cut in the lines 17B-17B and 17C-17C in FIG. 17A. A rectangular detection electrode 101 is disposed in plurality on a substrate 100, and is shaped so as to be exposed through a plurality of window portions provided in an insulator layer 102, and further, surrounded in the periphery by a grounded electric conductor layer 103. The signal generated by each divided detection electrode 101 is connected to a signal detection calculation circuit 105 by each independent wirings 104 and 106.

In a potential sensor of the present embodiment, it is possible to independently detect an inductive electrostatic charge generated in each of a plurality of rectangular detection electrodes 101 by allowing the signal detection calculation circuit 105 to carry a function capable of independently processing a plurality of signals. That is, the signal detection calculation circuit 105 has the function of receiving each of signals from a plurality of the electrodes, amplifying each of the received signals in the circuit, and calculating the results of the amplifications. Consequently, even in the case where a potential distribution of the object to be measured surface is not uniform, it is possible to dispose a plurality of detection electrodes on the substrate assembly at a desired position and to measure a surface potential of the desired position of the object to be measured.

In theory, since there is no restriction imposed on the size of the substrate assembly and the sheet-shaped structure, it is also possible to measure the potential distribution of the desired region at desired intervals by using an appropriate manufacturing method and material.

Figure 18:
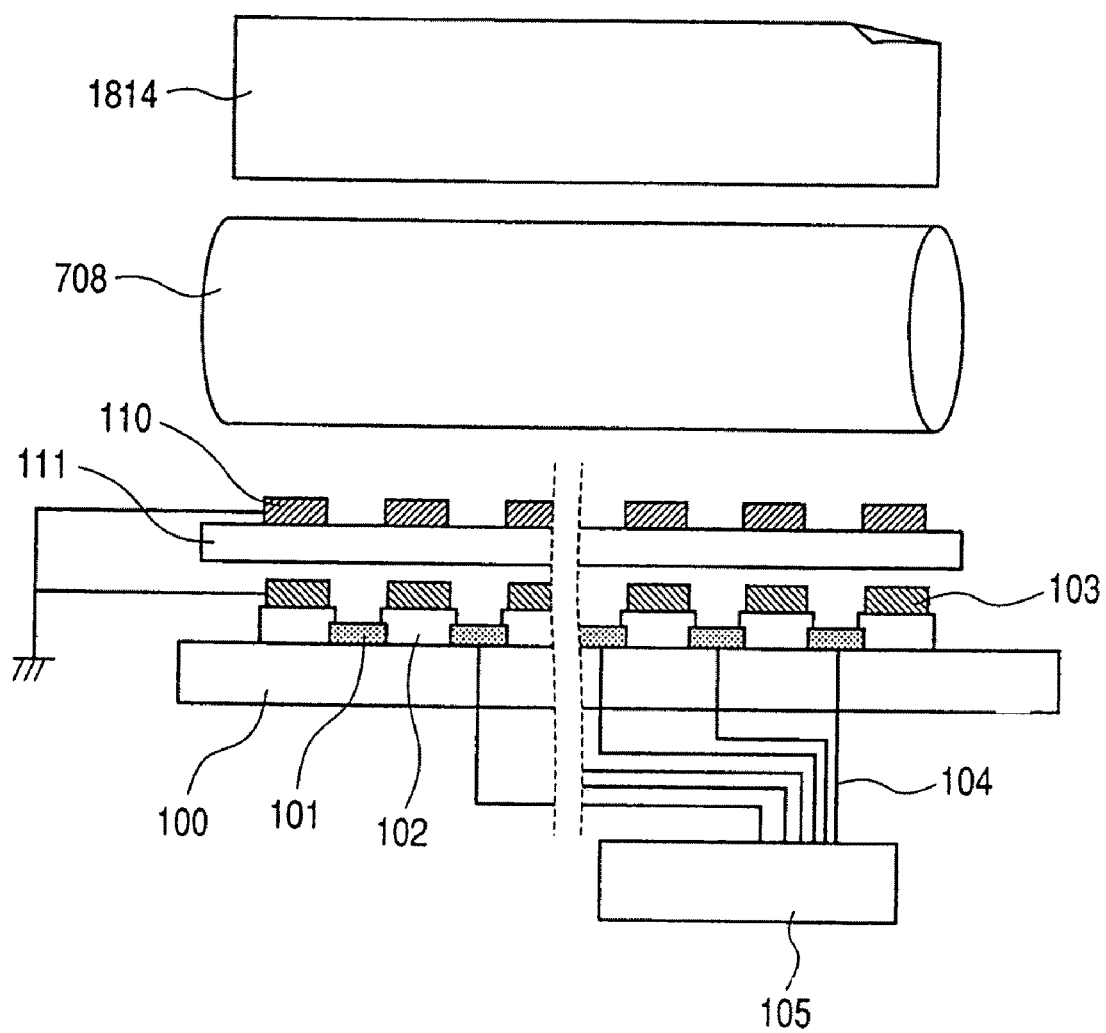
FIG. 18 is a view showing the positional relationship when the structure and the substrate assembly are installed in the vicinity of the photosensitive drum of an electrophotographic device, in the fifth embodiment.

FIG. 18 shows a structural example in which the potential sensor of the fifth embodiment is installed in opposition to a photosensitive drum 708 of an electrophotographic printing machine having the same length of about 290 mm as the longitudinal direction of a printing paper 1814 of A4 size. By using an appropriate design, material and manufacturing method, the substrate assembly and a sheet-shaped structure are prepared, which are installed at a position opposite to the photosensitive drum 708, thereby collectively measuring the potential distribution of the A4 longitudinal direction.

By summing signals induced in a plurality of detection electrodes 101 adjacent to one another by the potential sensor of the fifth embodiment, an effect of allowing a detection sensitivity to substantially increase can be obtained. As can be understood from formula (2), this summing function utilizes a fact that a signal output generated in the detection electrode is proportionate to an area of the detection electrode in the case of a mechanically modulated alternating electric field induction type, and this function can be therefore applied in the case where, because of a low surface potential of the object to be measured, an electrostatic charge induced in each detection electrode on the substrate assembly is small and is difficult to detect. This function can be realized by building into the signal detection calculation circuitry 105 a function for deciding the relative intensity of each signal from the detection electrodes 101, a function for recombining the circuits in such a way that the signals from a plurality of the electrodes are summed when the signals are extremely small and at such a level that it is difficult to detect them, and a function for amplifying those summed signals.

Sixth Embodiment

Figure 19:
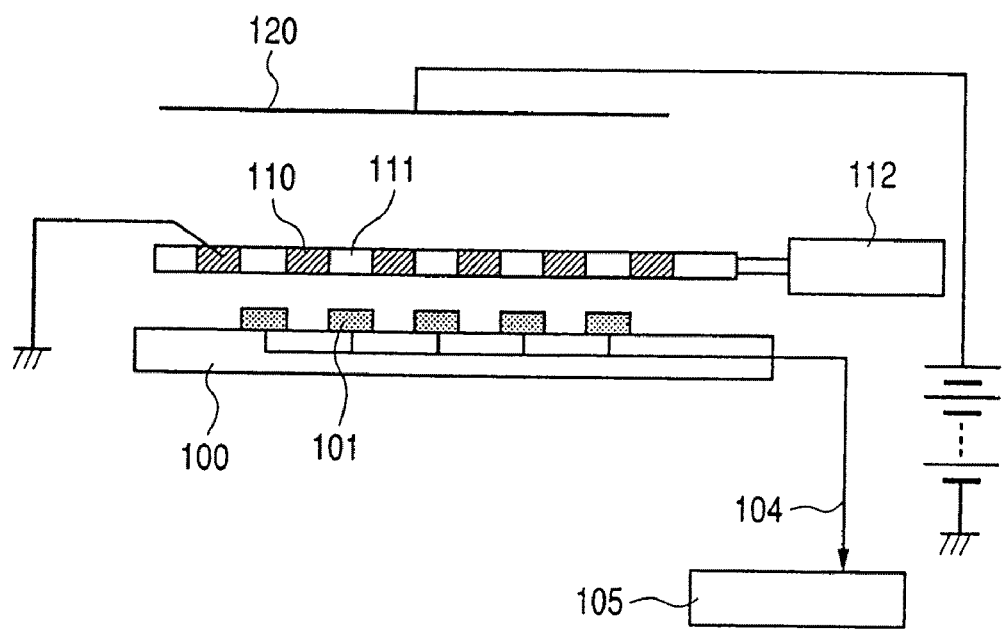
FIG. 19 is a sectional view showing a positional relationship between the object to be measured and the substrate assembly as well as the structure comprising the potential sensor in a six embodiment of the present invention.

A sixth embodiment of the present invention will be described with reference to FIG. 19. In the embodiments described so far, the detection electrode 101 of the substrate assembly has zoned its electric field reception portion by insulator layer 102 or surrounded it by electric conductor layer 103, so that electric lines of force coming from an object to be measured were received almost directly from the front side of the detection electrode. However, a structure to simply periodically dispose the detection electrode is also possible, and this structure is adopted in the sixth embodiment. As shown in FIG. 19, in the present embodiment, a sheet-shaped structure uses that of the first embodiment, and a substrate assembly uses that on which a plurality of rectangular detection electrodes 101 on a substrate 100 are disposed in the same period as the disposition period of the first solid material portion 111 and a second solid material portion 110 of the sheet-shaped structure. The detection electrode 101 is connected to a signal detection circuit 105 by a wiring 104.

Although a potential measuring theory is substantially the same as the embodiments described so far, in the present embodiment, since the detection electrode 101 is not zoned or surrounded by an insulator layer and an electric conductor layer, advancing extents of electric lines of force into the detection electrode 101 are controlled only by the sheet-shaped structure. On the other hand, the constitution of the substrate assembly becomes simple.

As for the method for preparing a potential sensor according to the present invention, a micro-machine technology which forms a micro structure by using a semiconductor processing technology is a representative example. When this technology is used, it is possible to batch-mold small type potential sensors on a silicon substrate in a large quantity. Specifically, by using the semiconductor processing technology such as a dry-etching technology, a thin-film formation technology, a sacrifice layer etching technology and the like, a substrate assembly structure, a sheet-shaped structure and a drive mechanism can be formed on the silicon substrate.

Figure 20:
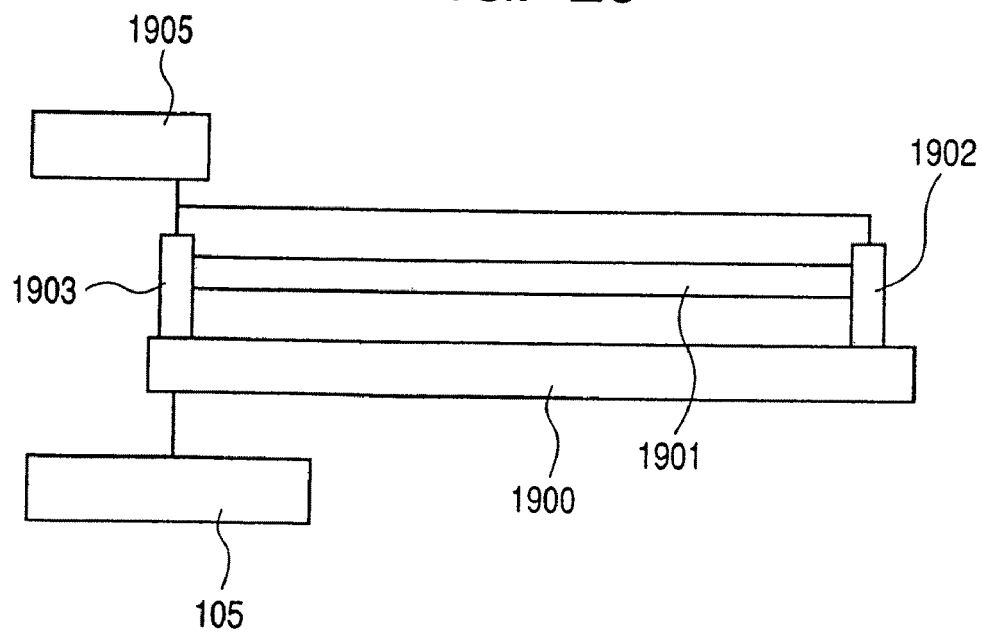
FIG. 20 is a side view showing an example in case of having prepared the potential sensor by using the ordinary assembling step in the embodiments of the present invention.
Figure 21:
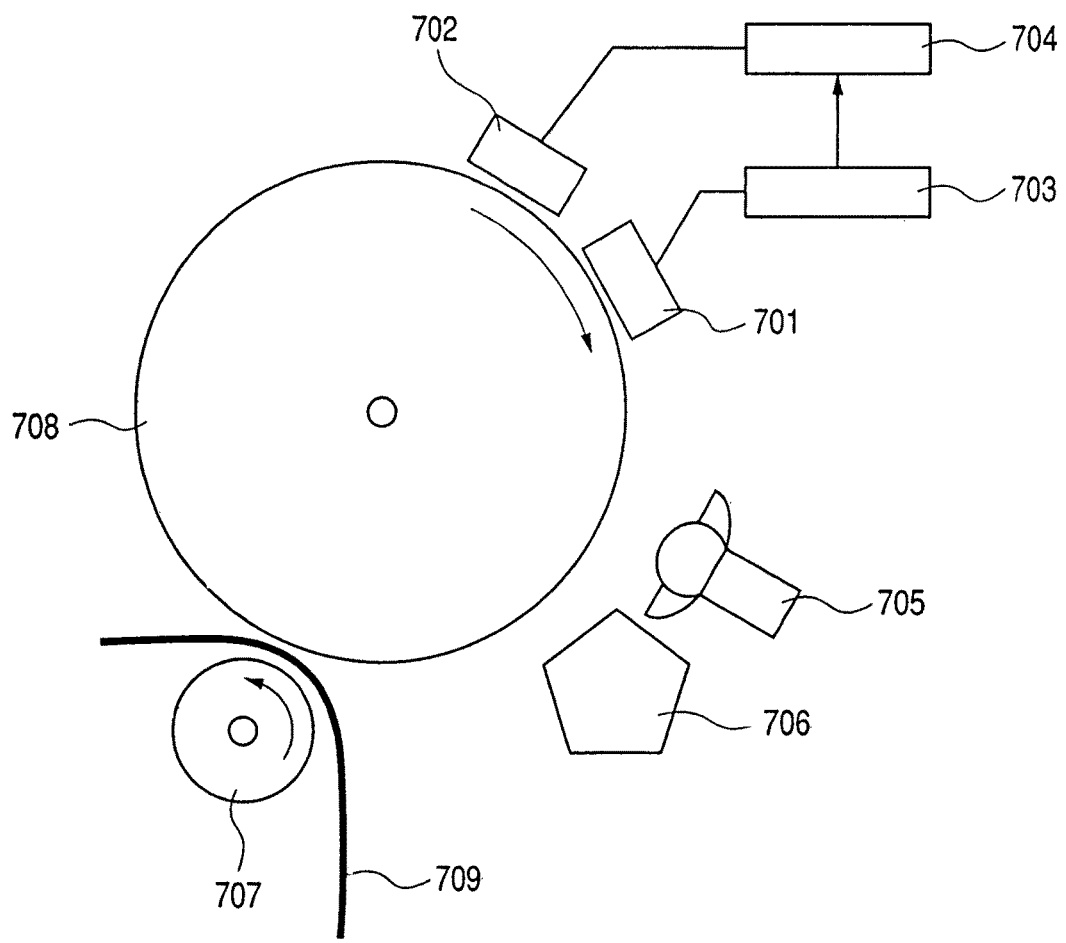
FIG. 21 is a view representing the vicinity of the photosensitive drum of the electrophotographic developing apparatus using the potential sensor according to the present invention.

Of course, the method for preparing the potential sensor according to the present invention is not restricted to such semiconductor processing technology. FIG. 20 shows a preferable example. In this example, a substrate assembly 1900 is formed of a print circuit substrate using glass epoxy, and a sheet-shaped structure 1901 is composed by forming an appropriately shaped metal thin film on a dielectric film such as polyimide into a film. Drive parts 1902 and 1903 connected to a drive circuit 1905 are mounted on the substrate assembly 1900 which is connected to a signal detection circuit 105, and the sheet-shaped structure 1901 is mounted between the drive parts 1902 and 1903 so as not to contact the substrate assembly 1900. Such constitution can be prepared by using an electronic part assembling step.

INDUSTRIAL APPLICABILITY

The potential measuring device of the present invention may be applied to a system comprised of a plurality of devices such as, for example, a host computer, an interface device, a reader, a printer and the like, and may be applied to one device, for example, an apparatus comprised of a copying machine and a facsimile.

The invention claimed is:

1. An electric potential measuring device comprising:
    a signal detection electrode having a divided structure, wherein each section of the divided detection electrode is independently connected to a detection calculation circuit;
    a movable structure comprised of a first solid material portion comprised of a dielectric and a second solid material portion comprised of a conductive material; and
    a drive mechanism for moving the movable structure in such a way as to change a positional relationship of the first and second solid material portions for the signal detection electrode,
    wherein the movable structure has no aperture and a charge induced on the signal detection electrode is modulated by moving the movable structure, to measure an electric potential of the object to be measured, and
    wherein the first solid material portion transmits electric lines of force radiated from the object to be measured to the signal detection electrode.

2. The electric potential measuring device according to claim 1, wherein said detection electrode is formed on a substrate disposed in opposition to the object to be measured, and said movable structure is periodically movable in a surface parallel to the substrate just above the surface of the object to be measured side of the signal detection electrode.

3. The electric potential measuring device according to claim 1, wherein said second solid material portion is periodically shaped in a predetermined direction, and said detection electrode is formed in a shape having the same direction and the same periodic length as the second solid material portion.

4. The electric potential measuring device according to claim 3, wherein the electric conductor layer of a shape having the same direction and the same periodic length as the second solid material portion is formed on a portion in which the signal detection electrode is not formed through an insulator layer.

5. The electric potential measuring device according to claim 1, wherein respective signals generated by each section of the divided detection electrode are independently measured and processed.

6. The electric potential measuring device according to claim 1, wherein said second solid material portion is comprised of said conductive material, and the conductive material is grounded.

7. The electric potential measuring device according to claim 1, wherein said movable structure is a sheet-shaped structure.

8. An image forming apparatus, comprising the electric potential measuring device according to claim 1 and an image forming means for performing a control of an image formation by using the electric potential measuring device.

9. An electric potential measuring method comprising the steps of:
    preparing between an object to be measured and a signal detection electrode a movable structure comprised of a first solid material portion comprised of a dielectric and a second solid material portion comprised of a conductive material; and
    moving the movable structure in such a way as to change a positional relationship of the first and second solid material portions for the signal detection electrode, wherein a charge induced on the signal detection electrode by electric lines of force emanating from the object to be measured is modulated, to measure an electric potential of the object to be measured, wherein the first solid material portion transmits electric lines of force radiated from the object to be measured to the signal detection electrode, and wherein the detection electrode has a divided structure, and each section of the divided detection electrode is independently connected to a detection calculation circuit.

10. The electric potential measuring method according to claim 9, wherein respective signals generated by each section of the divided detection electrode are independently measured and processed.

11. An electric potential measuring device comprising:
a signal detection electrode having a divided structure, wherein each section of the divided detection electrode is independently connected to a detection calculation circuit;
a movable structure comprised of a first solid material portion which transmits electric lines of force and a second solid material portion which shields from electric lines of force; and
a drive mechanism for moving the movable structure in such a way as to change a positional relationship of the first and second solid material portions for the signal detection electrode,
wherein the movable structure has no aperture and a charge induced on the signal detection electrode is modulated by moving the movable structure, to measure an electric potential of an object to be measured, and
wherein the first solid material portion transmits electric lines of force radiated from the object to be measured to the signal detection electrode.

12. The electric potential measuring device according to claim 11, wherein respective signals generated by each section of the divided detection electrode are independently measured and processed.

13. An electric potential measure method comprising the steps of:
preparing between an object to be measured and a signal detection electrode a movable structure comprised of a first solid material portion which transmits electric lines of force and a second solid material portion which shields from electric lines of force; and
moving the movable structure in such a way as to change a positional relationship of the first and second solid material portions for the signal detection electrode, wherein a charge induced on the signal detection electrode by electric lines of force emanating from the object to be measured is modulated, to measure an electric potential of the object to be measured,
wherein the first solid material portion transmits electric lines of force radiated from the object to be measured to the signal detection electrode, and
wherein the detection electrode has a divided structure, and each section of the divided detection electrode is independently connected to a detection calculation circuit.

14. The electric potential measuring method according to claim 13, wherein respective signals generated by each section of the divided detection electrode are independently measured and processed.

* * * * *